US011464139B2

(12) United States Patent
Lofgreen et al.

(10) Patent No.: US 11,464,139 B2
(45) Date of Patent: Oct. 4, 2022

(54) CONFORMABLE HEAT SINK INTERFACE WITH A HIGH THERMAL CONDUCTIVITY

(71) Applicant: Intel Corporation, Santa Clara, CA (US)

(72) Inventors: Kelly Lofgreen, Phoenix, AZ (US); Joseph Petrini, Gilbert, AZ (US); Todd Coons, Gilbert, AZ (US); Christopher Wade Ackerman, Phoenix, AZ (US); Edvin Cetegen, Chandler, AZ (US); Yang Jiao, Chandler, AZ (US); Michael Rutigliano, Chandler, AZ (US); Kuang Liu, Queen Creek, AZ (US)

(73) Assignee: Intel Corporation, Santa Clara, CA (US)

( * ) Notice: Subject to any disclaimer, the term of this patent is extended or adjusted under 35 U.S.C. 154(b) by 820 days.

(21) Appl. No.: 16/180,499

(22) Filed: Nov. 5, 2018

(65) Prior Publication Data

US 2020/0146183 A1 May 7, 2020

(51) Int. Cl.
*H05K 7/20* (2006.01)
(52) U.S. Cl.
CPC ................................ *H05K 7/20454* (2013.01)

(58) Field of Classification Search
CPC .................................................. H05K 7/20454
See application file for complete search history.

(56) References Cited

U.S. PATENT DOCUMENTS

| 2002/0070445 | A1* | 6/2002 | Tarter | H01L 23/433 257/714 |
| 2005/0061474 | A1* | 3/2005 | Gelorme | H01L 23/433 165/80.2 |
| 2008/0137300 | A1* | 6/2008 | Macris | H01L 23/42 361/699 |

* cited by examiner

*Primary Examiner* — Mukundbhai G Patel
(74) *Attorney, Agent, or Firm* — Essential Patents Group, LLP.

(57) ABSTRACT

A conformable heat sink interface for an integrated circuit package comprises a mounting plate having a first surface and a deformable membrane having a portion bonded to a second surface of the plate. A cavity is between the second surface of the plate and the deformable membrane. A flowable heat transfer medium is within the cavity. The flowable heat transfer medium has a thermal conductivity of not less than 30 W/m K. The deformable membrane is to conform to a three-dimensional shape of an IC package and the mounting plate has a second surface that is to be adjacent to a heat sink base.

20 Claims, 9 Drawing Sheets

CONFORMABLE HEAT SINK INTERFACE WITH A HIGH THERMAL CONDUCTIVITY

BACKGROUND

Thermal management in microelectronics packaging containing integrated circuits (ICs) is becoming an increasingly important issue. Packaging for modern high-performance integrated circuits must contend with increasingly larger scale microelectronic circuit integration, including vertical integration of multiple integrated circuits. Smaller form factors are associated with increasingly higher power densities, having concomitant heat transfer challenges. Large external thermal solutions in the form of high-efficiency heat sinks and heat transfer contact materials are presently the mainstay thermal management paradigm. One difficulty is uneven thermal contact between the heat sink interface or base plate and the package. Bond line thickness can be as much as 100 microns for a bare-die package, resulting in a 10°-20° C. temperature variation across a die. A conformable heat sink interface such as a gap pad may provide contact to non-planar die surfaces. However, gap pad materials have low thermal conductivity, negatively impacting the thermal resistance of the die center to the heat sink, which is generally the lowest of the die. To date, no solution that provides high conformability and high thermal conductivity as a thermal interface between package and heatsink has been made available.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
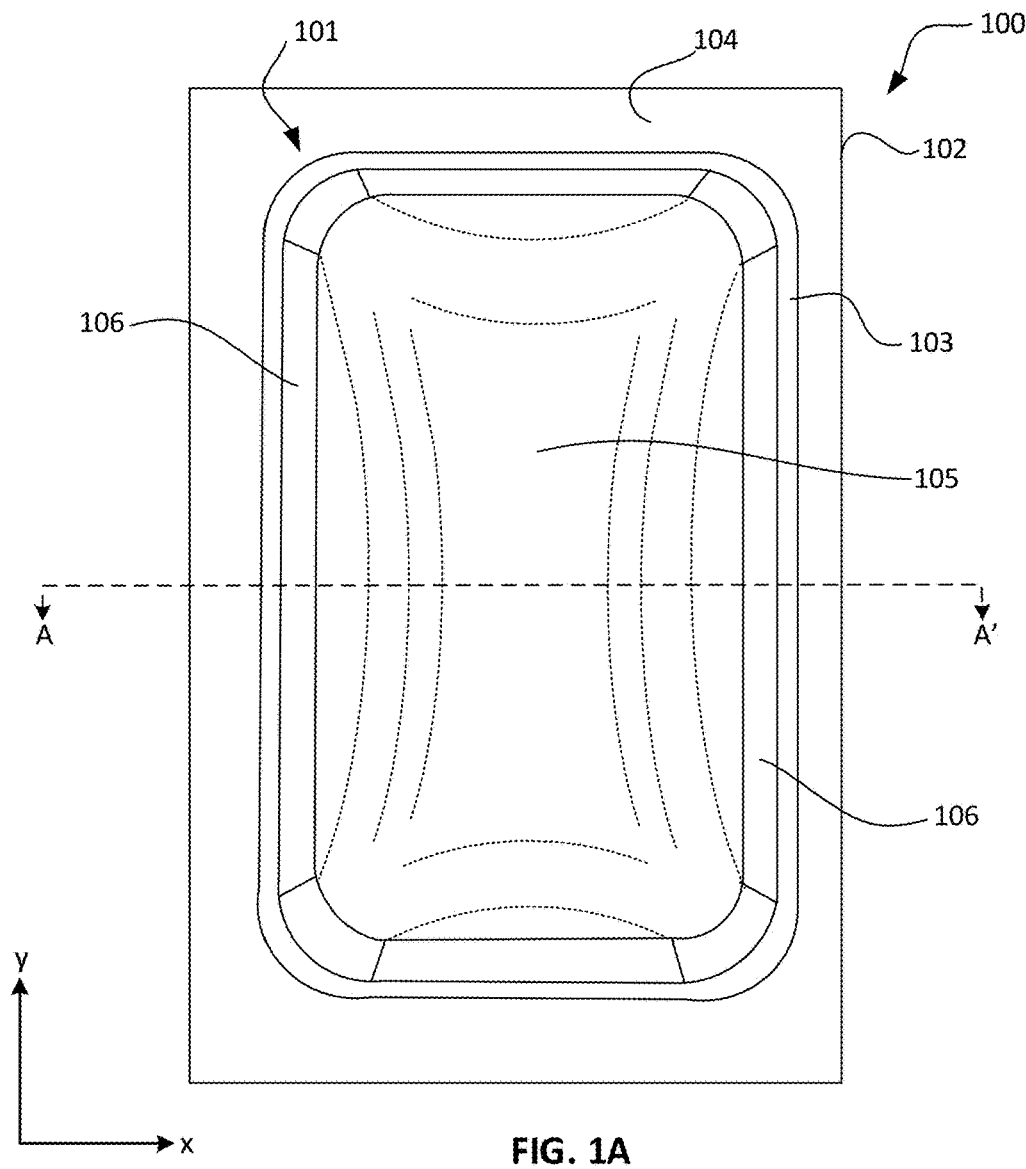
FIG. 1A illustrates a plan view in the x-y plane of a conformable heat sink interface comprising fill holes made through the mounting plate, according to some embodiments of the disclosure.

Described herein is a conformable heat sink interface that has a high thermal conductivity (high-k, where k is thermal conductivity in watts per meter per degree Kelvin, or W/mK), providing a large degree of thermal contact between a warped, non-planar or irregular IC package, and the typically planar base of a heat sink. In the disclosed embodiments, a flowable high-k medium is encapsulated within a deformable metal or a thin polymer encapsulation membrane. In some embodiments, the deformable encapsulation membrane is bonded and sealed to a mounting plate, forming a cavity encapsulated by the deformable membrane and the surface of the mounting plate. In some embodiments, the mounting plate comprises openings that communicate with the cavity encapsulated by the deformable membrane. The openings may terminate fill lines that extend though a heat sink, permitting filling of the encapsulation membrane with the flowable high-k medium, such as a liquid metal. In alternate embodiments, a fill tube is attached to the side of the deformable membrane for introducing the flowable high-k medium into the cavity, and for containment of overflow of the flowable medium to relieve pressure within the cavity. In some embodiments, the deformable membrane is a self-contained sac and is detachable, employing clamps to secure it to a mounting plate.

In some embodiments, the flowable heat transfer medium is a high-k liquid metal that has a liquidus temperature of 30° C. or less. As an example, a suitable liquid metal comprises a gallium-indium eutectic, comprising 75.5% gallium and 24.5% indium, and has a liquidus temperature of 15.7 C and a thermal conductivity (k) of 20 W/mK. In some embodiments, the flowable heat transfer medium is a flowable high-k powder, having a k of approximately 100 W/mK.

For packages having a relatively large degree of warpage or is non-planar, inadequate thermal contact due to low conformability and/or a low k (e.g., 0.5-3 W/mK) of the TIM over the entire surface of the package may engender temperature variations across the warped package. As an example, a package may have an out-of-plane of the package warpage of 100 microns measured between the package edges and the center. Application of a conventional TIM grease to the package exhibits a significant bond-line thickness (BLT). The BLT is the thickness of the bond line of the TIM that is formed between a flat heat sink baseplate and the upper surface of the package or die that may be on the order of 100 microns at the corners and edges.

Combined with the low k of the TIM, the thermal resistance may be large at the corners and edges of the package relative to the center. To reduce a large BLT, the load on a package mounted in a heat sink mounting assembly may be increased in order to flatten it. Increasing the load on a package may incur potential damage or breakage to the package components and/or die. It will be shown below that the conformable heat sink interface of this disclosure outperforms a conventional thermal solution for warped packages. The deformable membrane of the conformable heat sink interface conforms to the out-of-plane contours of a warped or irregular-profile IC package, such as a bare-die package having multiple dies of differing profiles, allowing substantially all points on the non-planar package surface to be in intimate contact with a high-k heat transfer surface. Additionally, the load on the package when mounted with the conformable heat sink interface is substantially smaller (e.g., 80% less load) than needed for a conventional thermal solution to achieve similar performance. The risk of breakage of the package is significantly reduced when employing the disclosed conformable heat sink interface in a package mount.

In some embodiments, the deformable membrane comprises a shape memory alloy (SMA) that is pre-shaped to conform to an irregular package profile. In some embodiments, mesas are embossed in a membrane sheet comprising a SMA. The mesas have differing z-heights that are complimentary to a specific IC package z-height profile. For example, the specific IC package may be a bare-die package comprising multiple dies having different z-heights.

According to some embodiments, the mesas are embossed into the SMA membrane at temperatures above a crystalline phase transition of the SMA (e.g., a transition between the martensite phase and the austenite phase for nickel-titanium (NiTi) SMAs). When mesas are formed in the austenitic phase of the SMA material, the material is plastically deformed, having a permanent shape. When the SMA is held at a temperature below the martensite-austenite phase transition (e.g., 25° C.), the material is the in the lower temperature (martensite) phase. When the SMA is loaded or stressed by compression against a die, it becomes superelastic, readily deforming under low stress to conform to the surface of the warped die.

As the die underlying the mesa generates heat, the SMA warms and at elevated temperatures trigger a phase transition, (e.g., a martensite to austenite transition, where a NiTi SMA transitions into the high temperature austenite phase). In the high-temperature phase, the material is in shape memory mode, and attempts to regain its original plastically-deformed shape. During this process, the material stiffens and the mesas bulge, increasing force on the underlying dies. The contact area between mesa and die may increase by the action of the shape memory process. The added force may be equivalent to increasing the load over the dies. The load may be tunable as the extent of the phase transition is temperature dependent and is hysteretic, responding to the alloy composition of the SMA.

Each one of the mesas may be embossed to protrude to a different height over the contacting surface of the deformable membrane. When the conformable heat sink interface is lowered over a package, the distance between the contacting surface of the conformable interface and the surface of the package substrate may be adjusted to allow each of the mesas to contact the corresponding dies with a constant force. The z-height that each of the raised regions may be engineered to deliver a preset force over the dies.

Here, the term "die" generally refers to a piece of semiconductor wafer that has been cut into rectangular sections referred to as dies. Each die has integrated circuitry on one or both sides.

Here, the term "substrate" generally refers to the substrate of an integrated circuit (IC) package. The package substrate is generally coupled to the die or dies contained within the package, where the substrate comprises a dielectric having conductive structures on or embedded with the dielectric. Throughout this specification, the terms "substrate" or "package substrate" are used to refer to the substrate of an IC package.

Here, the term "package" generally refers to an IC (microelectronics) package comprising a package substrate and one or more dies attached to the substrate. The package may be encapsulated with a dielectric material, such as an epoxy resin, to embed and protect the attached dies and any exposed metallization on the substrate from the environment. In other embodiments, the package may be a "bare die" package, where one or more dies attached to the substrate are exposed.

Here, the term "microprocessor" generally refers to a high-performance IC package comprising a central processing unit (CPU), graphical processing unit (GPU) or microcontroller as part or all of its circuitry. The microprocessor package is referred to as a "microprocessor" in this disclosure. A microprocessor socket receives the microprocessor and couples it electrically to a printed circuit board (PCB) such as a computer motherboard.

Here, the term "thermal solution" generally refers to heat transfer components of a microelectronics thermal management system for a high-performance power-consuming IC package such as, but not limited to, a microprocessor. The thermal solution typically comprises a heat sink, where the IC package is sandwiched between the heat sink and a socket mounted on PCB, such as the motherboard of a computer. A specially designed plate or heat sink mount is provided on the motherboard to accommodate securing the heat sink. Mounting bolts are commonly used, but clamping systems may also be employed to secure the heat sink. The heat sink is conventionally mounted with a pre-determined load on the IC package, such as the CPU, mostly to ensure proper seating of the IC package in the socket and sufficient contact between the heat sink and the IC package. The IC package referred to here is typically a microprocessor employed as a central processing unit (CPU) or a graphical processing unit (GPU), as defined above, which dissipates large amounts of consumed power as heat, requiring efficient cooling to function properly. In most conventional microelectronics thermal management systems, the principle mode of heat transfer away from the IC package is conduction through solid materials, then ultimately by forced convection from air blown over heat sink fins. In some systems, liquid coolants are circulated over the IC package in a convective heat exchange unit. Other components of a thermal may comprise an integrated heat spreader and liquid thermal interface materials (TIM) to ensure sufficient heat transfer at component interfaces.

Here, the term "deformable membrane" generally refers to a thin and deformable sheet of material that is in the form of a closed sac-like structure. In this disclosure, the membrane contains a liquid or otherwise flowable heat transfer medium.

Here, the term "shape memory alloy" (SMA) generally refers to a type of metal alloy that has a memory of an original shape that was formed when the SMA was heated above a solid-state phase transition temperature. If the SMA is stressed while at a temperature below the phase transition temperature, the SMA may become superelastic. If the SMA is heated to a temperature above the phase transition temperature, it returns to the original shape by the shape memory effect.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a plan view in the x-y plane of conformable heat sink interface 100, according to some embodiments of the disclosure.

Conformable heat sink interface 100 comprises deformable membrane 101 attached to mounting plate 102. In some embodiments, deformable membrane 101 is a deformable metal sheet that has a thickness of at least 10 microns. In some embodiments, deformable membrane 101 comprises thin foils comprising nickel, titanium, nickel-titanium alloys, copper, copper-aluminum-nickel alloys, copper-aluminum-zinc alloys, iron-manganese-silicon alloys or stainless steel. In some embodiments, deformable membrane 101 comprises a sheet or foil comprising a polymeric material, such as, but not limited to, polyethylene, polypropylene, polyesters such as polyethylene terephthalate (PET), polyimides, polyamides, polyurethanes, polytetrafluoroethylenes (PTFE), fluorinated ethylene propylene (FEP) and perfluoroalkoxy alkanes (PFA) and silicones. Foil thicknesses may range from 10 microns to 50 microns. The choice of thickness may depend on the stiffness (e.g., Young's modulus) of the material.

In some embodiments, deformable membrane 101 is sealed to mounting plate 102 by brazing sealing rim 103 along the edges of deformable membrane 101 to mounting plate surface 104 of mounting plate 102. In some embodiments, deformable membrane 101 is sealed to mounting plate surface 104 of mounting plate 102 by soldering sealing rim 103 to mounting plate surface 104. In some embodiments, deformable membrane 101 is sealed to mounting plate surface 104 by organic adhesives, such as, but not limited to, silicone rubber, acrylics, and epoxies.

Deformable membrane 101 comprises contacting surface 105 extending between sidewalls 106 over mounting plate surface 104. As will be shown in FIG. 1B, deformable membrane 101 sidewalls 106, contacting surface 105 and mounting plate surface 104 at least partially surround an interior cavity.

Figure 1B:
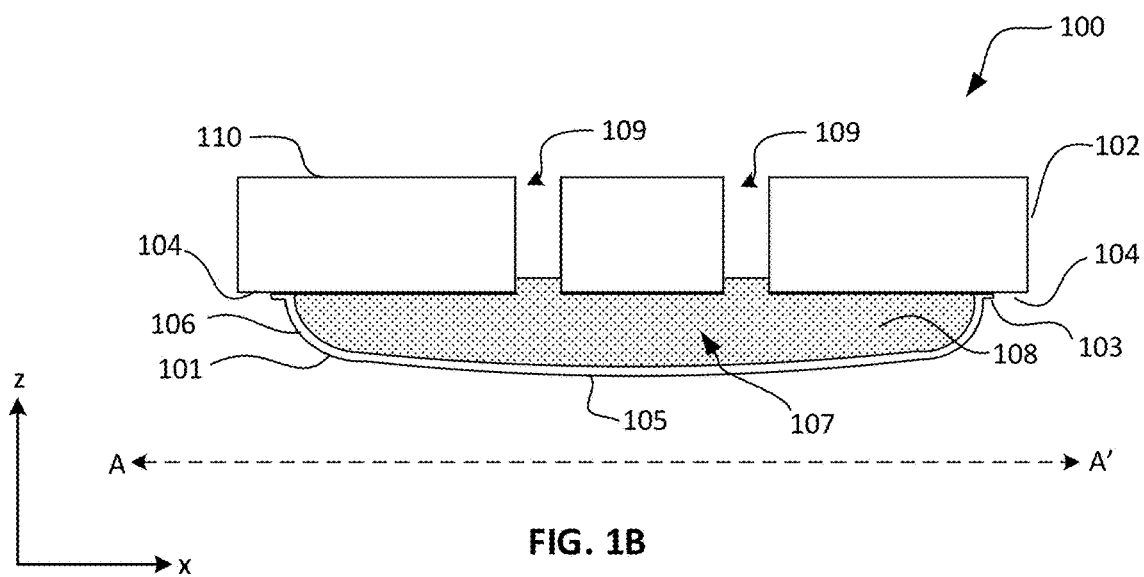
FIG. 1B illustrates a cross-sectional view in the x-z plane of the conformable heat sink interface shown in FIG. 1A, according to some embodiments of the disclosure.

FIG. 1B illustrates a cross-sectional view in the x-z plane of conformable heat sink interface 100, according to some embodiments of the disclosure.

The cross-sectional view of FIG. 1B is taken along cut line A-A' in FIG. 1A. Deformable membrane 101 partially surrounds interior cavity 107 that is filled with flowable heat transfer medium 108. In some embodiments, flowable heat transfer medium 108 is a high-k liquid metal that comprises gallium or gallium alloys, such as, but not limited to, gallium-indium alloys, gallium-indium-tin alloys, and gallium-indium-tin-zinc alloys. In some embodiments, the liquid metal compositions have liquidus temperatures of approximately 30° C. or less. As an example, an alloy composition of 95% gallium and 5% indium forms a eutectic having a liquidus temperature of approximately 25° C. As a further example, an alloy eutectic composition comprising 61% gallium, 25% indium, 13% tin and 1% zinc has a liquidus temperature of approximately 8° C. Gallium, as a pure element, has a melting point of approximately 30° C.

Thermal conductivities of gallium alloys range between approximately 15 W/mK to approximately 30 W/mK. Gallium-based liquid metals may have viscosities under 8 centipoise (cP), having a consistency similar to that of water, enabling a high degree of conformability. Gallium-based liquid metals may completely wet the inner surfaces of deformable membrane 101, so that the flowable heat transfer medium 108 may be uniformly distributed within interior cavity 107 without voids, ensuring low thermal resistance at all points along a die in contact with conformable interface 100.

In some embodiments, flowable heat transfer medium 108 comprises a powdered graphitic material or a powdered metal (e.g., copper powder, k~200-300 W/mK). In some embodiments, flowable heat transfer medium 108 comprises a boron nitride powder (k~100 W/mK).

Sidewalls 106 of deformable membrane 101 extend substantially in the z-direction from sealing rim 103 that extends over mounting plate surface 104 along the perimeter of deformable membrane 101. Sidewalls 106 gradually blend with contacting surface 105, which extends substantially in the x-direction, but may have convex curvature, as shown in FIG. 1B, from slight bulging due to the hydrostatic pressure of the liquid metal contained within. Sidewalls 106 may also have a convex curvature. In some embodiments, contacting surface 105 joins sidewalls 106 at a pleated junction in the shape of sharp corners. In some embodiments, sealing rim 103 is bonded directly to mounting plate surface 104 as described above to seal flowable heat transfer medium between deformable membrane 101 and mounting plate surface 104.

Apertures may be present on the body of conformable thermal interface 100 to enable introduction of flowable heat transfer medium 108 into interior cavity 107. In the illustrated embodiment, fill ports 109 extending through mounting plate 102 from upper mounting plate surface 110 to lower mounting plate surface 104 may be employed to receive tubing from a reservoir containing flowable heat transfer medium 108. In some embodiments, the communication between cavity 107 and fill ports 109 may provide some internal pressure relief and compensation when conformable interface 100 is engaged with a package. In the illustrated embodiment of FIG. 1B, fill ports 109 provide an extended volume of internal cavity 107 as some of the material of the flowable heat transfer medium extends into fill ports 109. Fill ports 109 may be threaded to accept pipe or tubing adapters to connect tubing for filling purposes, and caps for closing fill ports 109 after filling is complete.

Figure 2A:
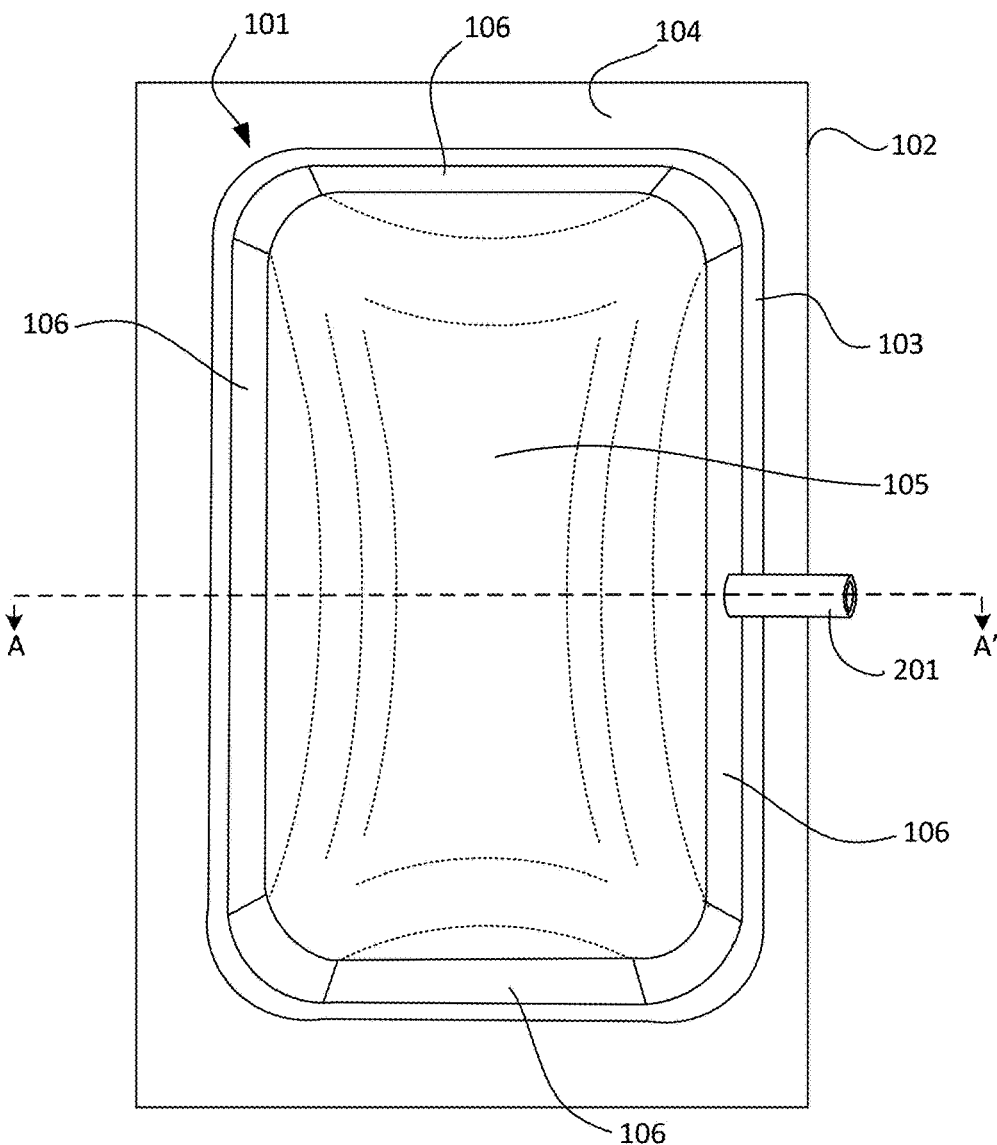
FIG. 2A illustrates a plan view in the x-y plane of a conformable heat sink interface having a fill/overflow tube attached to a deformable membrane, according to some embodiments of the disclosure.

FIG. 2A illustrates a plan view in the x-y plane of conformable heat sink interface 200, according to some embodiments of the disclosure.

In the illustrated embodiment shown in FIG. 2A, conformable heat sink interface 200 has structural features in common with conformable heat sink interface 100 shown in FIGS. 1A and 1B. Conformable heat sink interface 200 comprises fill/overflow tube 201, which extends laterally from sidewall 106 of deformable membrane 101. Fill/overflow tube 201 is shown as a stub, but in some embodiments, it may extend a large distance, terminating at a valve or at the entrance to a vessel containing a flowable heat transfer medium (e.g., flowable heat transfer medium 108). In some embodiments, fill/overflow tube 201 is permanently sealable after cavity 107 is filled with the flowable heat transfer medium. Fill/overflow tube 201 may have a crimp seal, a sealable flap (not shown) that may be heat-sealed, or is heat sealed by welding shut the open end.

Fill/overflow tube 201 may replace fill ports 109 shown in FIG. 1B for both filling and pressure relief within cavity 107. In some embodiments, fill/overflow tube 201 comprises a polymeric material, such as polyethylene, polyvinyl chloride, silicones, polytetrafluoroethylene (PTFE), fluorinated hydrocarbons such as fluorinated ethylene propylene (FEP), polyimides (e.g., Kapton), polyetherimides (e.g., Ultem), and polyurethanes. In some embodiments, fill/overflow tube 201 comprises a metal that is the same metal comprised by deformable membrane 101, or may be a different metal.

Figure 2B:
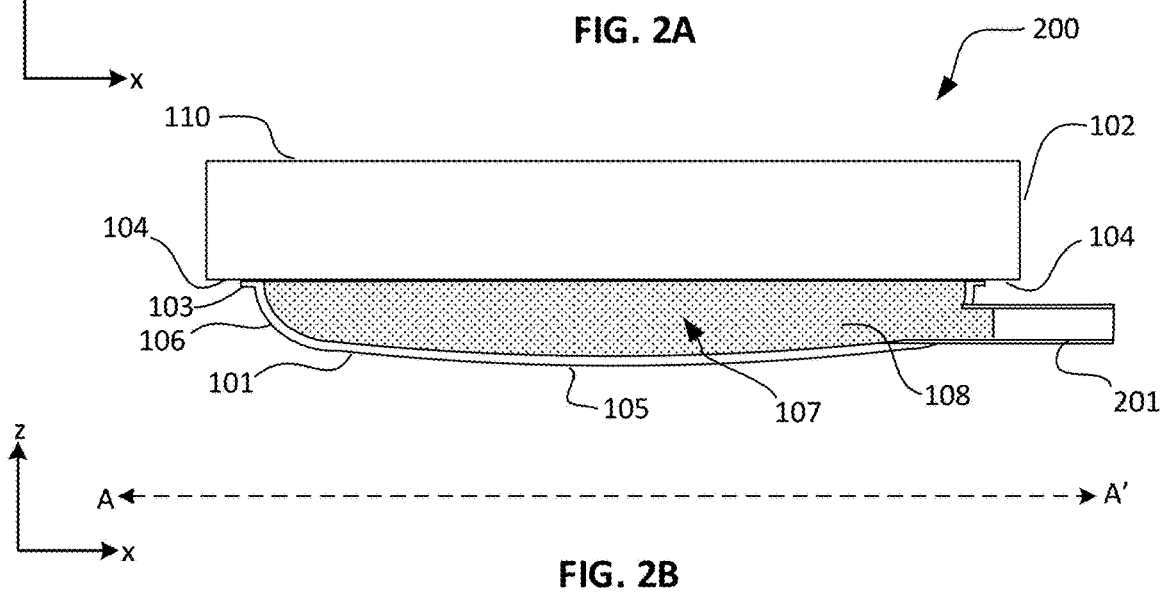
FIG. 2B illustrates a cross-sectional view in the x-z plane of the conformable heat sink interface shown in FIG. 2A, according to some embodiments of the disclosure.

FIG. 2B illustrates a cross-sectional view in the x-z plane of conformable heat sink interface 200, according to some embodiments of the disclosure.

In FIG. 2B, the cross-sectional view is taken along cut line A-A' in FIG. 2A. In the illustrated embodiment, fill/overflow tube 201 is shown as a stub that extends laterally from sidewall 106. It will be understood that any of the four sidewalls 106 may be chosen for the side of deformable membrane 101 to which fill/overflow tube 201 is attached. Fill/overflow tube 201 may provide pressure relief and/or compensation and overflow uptake when conformable heat sink interface is engaged, replacing fill ports 109 in mounting plate 102, shown in FIG. 1B. This is indicated in FIG. 2B, were some of the material from flowable heat transfer medium 108 is within fill/overflow tube 201.

Figure 3A:
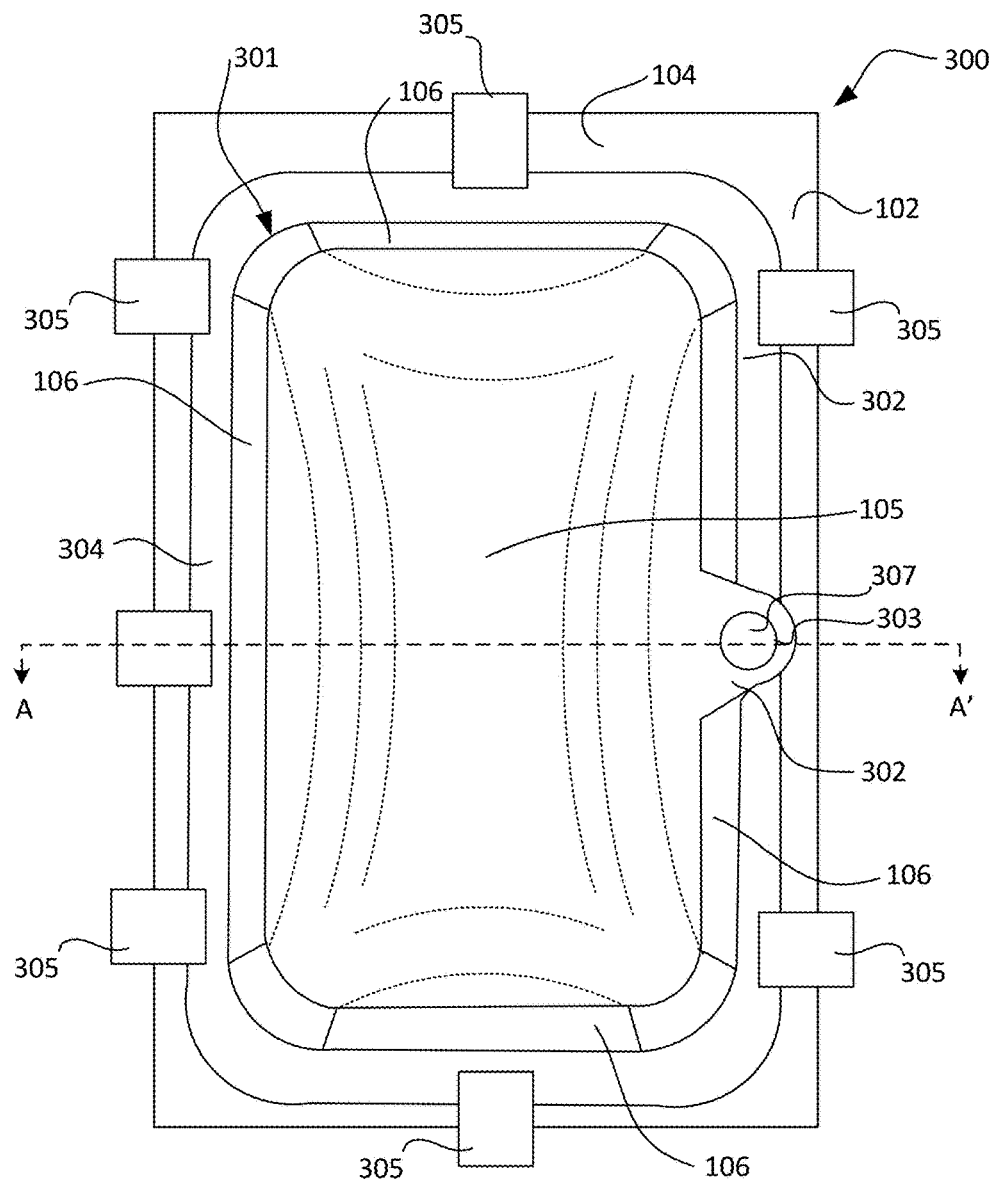
FIG. 3A illustrates a plan view in the x-y plane of a conformable heat sink interface comprising a detachable deformable membrane comprising a fill tab, according to some embodiments of the disclosure.

FIG. 3A illustrates a plan view in the x-y plane of conformable heat sink interface 300 comprising deformable membrane 301 and fill tab 302 extending from deformable membrane 301, according to some embodiments of the disclosure.

In the illustrated embodiment shown in FIG. 3A, conformable heat sink interface 300 deformable membrane 301, a self-contained membrane sac structure that may be substituted for deformable membrane 101. In some embodiments, deformable membrane 301 is attached to mounting plate 102 by a mechanical clamping mechanism described below and shown in FIG. 3A. In alternative embodiments, deformable membrane 301 is bonded to mounting plate 102 by adhesion or by solder/welding joints.

Fill tab 302 extends laterally from sidewall 106 and partially from the edge of contacting surface 105 of deformable membrane 301. In some embodiments, fill tab 302 is sealable, where orifice 303 comprises a heat-sealable flap or a removable cap (not shown) that may be screwed or pressed over orifice 303. Fill tab 302 may be employed as a point of introduction of a flowable heat transfer medium (e.g., flowable heat transfer medium 108) into interior cavity 107.

In the illustrated embodiment, retaining flange 304 is over a perimeter of deformable membrane 301 similar to sealing rim 103 of deformable membrane 101 (e.g., shown in FIGS. 1A and 2A) for mechanical attachment of deformable membrane 301 to mounting plate 102. Clamps 305 fit over retention flange 304, which is in turn is over a perimeter sealing rim (e.g., sealing rim 103 in FIG. 2B).

In some embodiments, a stiff backing (e.g., backing 306, shown in FIG. 3B) is integral with deformable membrane 101 and extends laterally from the base of sidewalls 106 a distance over mounting plate surface 104, providing a rim around the perimeter of deformable membrane 101 over which retention flange 304 is seated. In some embodiments, clamps 305 are bolted to mounting plate 102 to attach deformable membrane 301 to mounting plate 102. In some embodiments, clamps 305 are spring-loaded by tension springs, and may swivel to clamp over retention flange 304 and swivel in reverse for rapid unclamping of retention flange 304. In some embodiments, retention flange 304 is bolted directly to mounting plate 102 to attach deformable membrane 301 to mounting plate 102, omitting clamps 305.

Figure 3B:
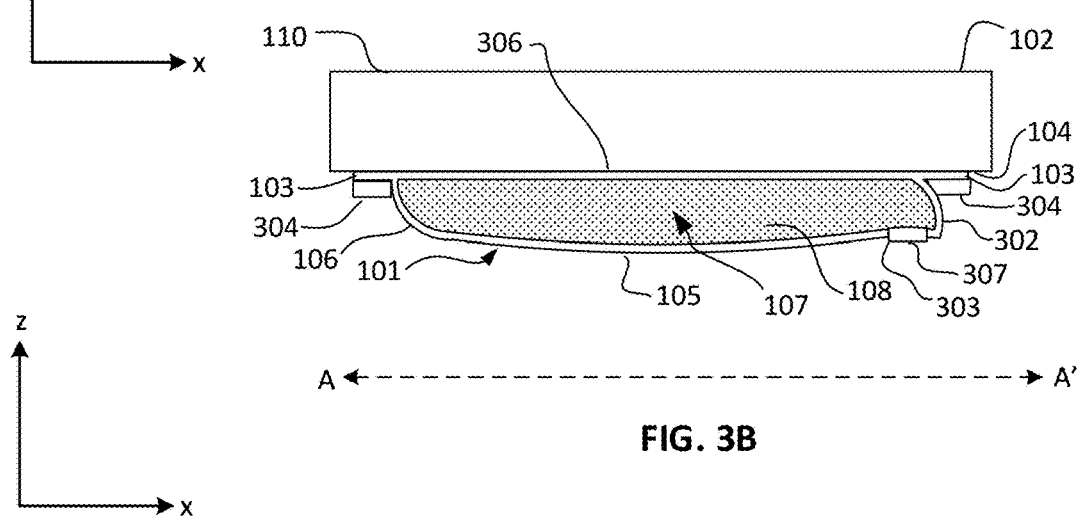
FIG. 3B illustrates a cross-sectional view in the x-z plane of the conformable heat sink interface shown in FIG. 3A, according to some embodiments of the disclosure.

FIG. 3B illustrates a cross-sectional view in the x-z plane of conformable heat sink interface 300, according to some embodiments of the disclosure.

In FIG. 3B, the cross-sectional view is taken along cut line A-A' in FIG. 3A. Deformable membrane 301 is a closed sac surrounding internal cavity 107 and flowable heat transfer medium 108. Backing 306 that extends along a portion of deformable membrane 301 that is adjacent to mounting plate surface 104 and opposite contacting surface 105. In some embodiments, backing 306 is integral with sidewalls 106, which rise over backing 306 to join contacting surface 105. Sealing rims 103 extend outwardly from the perimeter of backing 306, and are sandwiched between retention flange 304 and mounting plate surface 104.

In some embodiments, deformable membrane 301 completely encloses internal cavity 107 and flowable heat transfer medium 108. Backing 306 is not bonded to mounting plate surface 104, permitting deformable membrane 301 to be removed from mounting plate 102. In some embodiments, backing 306 has a significantly greater stiffness compared to sidewalls 106 and contacting surface 105. Backing 306 may comprise a stiff (e.g., not readily deformable) sheet that is bonded to a back portion of deformable membrane 301 that extends between sidewalls 106 along mounting plate surface 104. In some embodiments, backing 306 is a sheet or plate adhered to the portion of deformable membrane 301 that is adjacent to mounting surface 104.

Fill tab 302 extends from sidewall 106 on the right side (in reference to the figure) of deformable membrane 301. Orifice 303 is shown sealed by flap 307. Once sealed, cavity 107 may not have a pressure-compensation or pressure relief mechanism.

Figure 4A:
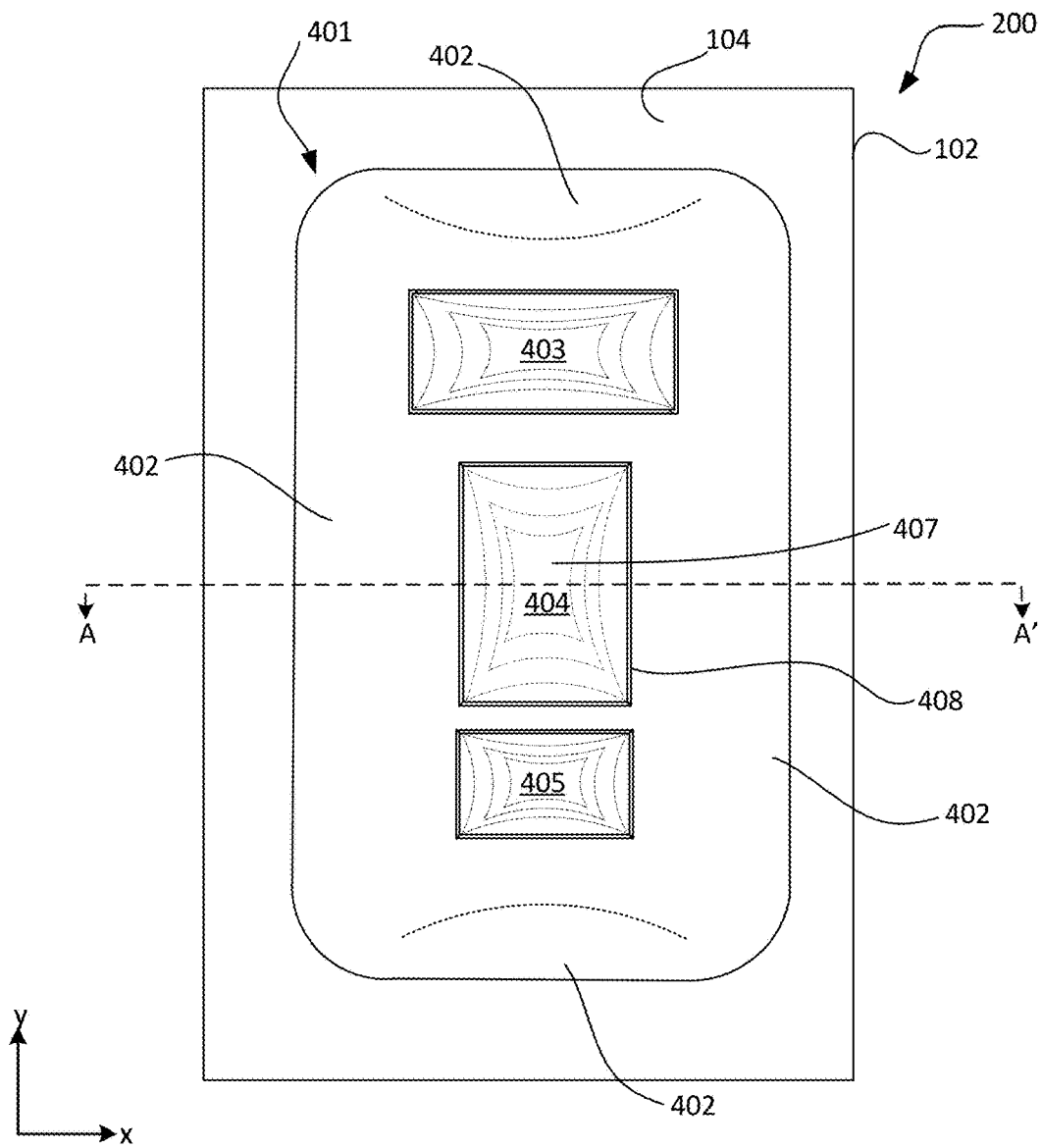
FIG. 4A illustrates a plan view in the x-y plane of conformable heat sink interface having a deformable membrane comprising a shape-memory alloy and embossed with mesas having shape memory, according to some embodiments of the disclosure.

FIG. 4A illustrates a plan view in the x-y plane of conformable heat sink interface 400 having a deformable membrane comprising a shape-memory alloy and embossed with mesas having shape memory, according to some embodiments of the disclosure.

Conformable heat sink interface 400 comprises deformable membrane 401 attached over mounting plate 102. In the illustrated embodiment, deformable membrane 401 is attached to mounting plate surface 104 along perimeter 402 by bonding methods noted above, such as brazing, solder bonding and organic adhesives. In alternate embodiments, deformable membrane 401 is attached to mounting plate 102 mechanically. In some embodiments, deformable membrane 401 comprises a shape-memory alloy (SMA) that is embossed with mesas 403, 404 and 405, whose shapes and thicknesses may compliment a particular three-dimensional die profile. Mesas 403-405 may be unique to a specific package architecture. In the embodiment shown in FIG. 4A, the x and y coordinates of mesas 403-405 are to align to three dies on a package substrate that are complimentary in shape and z-height to each of mesas 403-405.

In some embodiments, deformable membrane 401 comprises binary nickel-titanium (NiTi) SMA alloys or ternary nickel-titanium-cobalt (NiTiCo) alloys. Binary NiTi alloy compositions generally include atomic ratios ranging between 48.5 atom % of nickel to 51 atom % of nickel (remainder being titanium). The specific compositions of the binary alloys may be adjusted to engineer the transition temperature ranges relating to austenite transitions and martensite transitions. For example, the room temperature (e.g., temperatures ranging between 20° C. and 25° C.) crystalline phase of the SMA may be engineered to be either martensite or austenite, by making small adjustments in the alloy composition. Other SMA compositions include, but are not limited to, copper-aluminum-nickel alloys, copper-zinc-aluminum alloys and iron-manganese-silicon alloys. Although these alloys may be employed as SMAs, the following discussion will focus on NiTi alloys as exemplary SMA materials.

The crystalline structure of deformable membrane 401 is temperature- and stress-sensitive as described earlier, exhibiting a reversible solid-state phase transition (e.g., a reversible martensitic phase transition for binary nickel-titanium composition or ternary nickel-titanium-cobalt composition SMAs), within a temperature range unique to the particular SMA. As an example, the SMA may be in a low-temperature twinned cubic martensite crystalline phase, having a monoclinic crystallographic lattice, or the SMA may be in a higher temperature austenite crystalline phase, having a cubic crystallographic lattice. The transition between cubic austenite and monoclinic martensite is instantaneous, due to the twinning of the lattice where the lattice shifts by less than a unit cell. In both binary and ternary NiTi SMAs, twinning is a crystal lattice transformation that is not dependent on solid state diffusion of atoms, but is an instantaneous process, occurring at the speed of sound of the material. It is also reversible. This is in contrast to martensitic phase transitions in steel alloys, which depend on diffusion of atoms enabled by slip dislocations.

The phase transition from martensite to austenite may initiate at a starting temperature $A_s$ that can be close to room temperature, and finish at a temperature $A_f$, where $A_f$ may be approximately 20° C. above $A_s$. Above $A_f$, the SMA material is substantially pure austenitic NiTi alloy. As the phase transition is reversible, formation of martensite domains from 100% austenitic alloy begins at temperature $M_s$ and completes (100% martensite) at temperature $M_f$, where $M_f < M_s$.

It should be noted that the reversible martensite-austenite phase transition exhibits a marked temperature hysteresis. By way of example, the SMA may initially be in the martensite phase at room temperature. It may then be heated to the austenite initiation temperature $A_s$ and beyond, following a heating curve of a temperature hysteresis cycle to complete its transition from martensite to austenite at an end-of-transition temperature $A_f$. To transition back to martensite, the SMA may follow a cooling curve of the temperature hysteresis cycle. The SMA begins to transform back to martensite at a temperature $M_s$ that may be approximately 20° to 25° C. lower than $A_f$, and completes transition to substantially 100% martensite at a temperature $M_f$, below which the material remains substantially pure martensite. $M_s$ may be 15° to 20° C. above $M_f$, whereas $A_f$ may be 20°-30° C. above $M_f$. The hysteresis cycle is repeatable. As an example of the magnitude of these temperatures, $M_s$ ranges from approximately +73° C. to −73° C. corresponding to the above-stated Ni content range (e.g., 48.5 atom % to 51 atom % Ni) in a binary NiTi alloy, where $M_s$ decreases with increasing Ni content.

When in both the austenitic and martensitic phases, an SMA exhibits superelasticity. The superelastic property is complimentary to the shape memory property. When the SMA is in the martensite phase, superelasticity arises when the martensitic lattice constants shift under strain at constant temperature, and the unit cell undergoes a detwinning transformation. When austenitic SMA material is strained at constant temperature, the cubic austenite lattice shears into detwinned stress-induced martensite (monoclinic) and the material is also superelastic.

Macroscopically, superelasticity is characterized by an extended stress plateau that is attained after an initial elastic deformation, where the stress remains constant while the strain increases, as observed by obtaining a stress vs. strain curve. Some NiTi SMA materials may undergo up to an 8% increase in strain without an increase in stress in the superelastic state. This stress-induced phase transition is reversible as well, but follows a mechanical stress-strain hysteresis, similar to the thermal hysteresis described above. Materials in the superelastic state are highly ductile and readily deform when subjected to a load or to a stress. Superelasticity may be exploited by mesas 403-405 when engaged with underlying dies to conform to any non-planarity, such as warpage that the dies may exhibit, or irregular die profiles in a bare-die package.

The strain induced in the material by the embossing process may exceed the yield limit (e.g., beyond 8% strain in some binary NiTi alloys), resulting in plastic (e.g., permanent) deformation of the material. Once embossed at temperatures above $A_f$, the material may be cooled to a temperature below $A_f$, and down to $M_f$ (the temperature at which transition to martensite is substantially 100% complete; $M_f < A_f$) or below, allowing the material to revert to the martensite phase without undergoing a macroscopic change in the shape assumed after embossing deformable membrane 401 in the austenite phase.

As an example, mesas 403-405 may be formed by cold-working (e.g., stamping) deformable membrane 101, comprising a binary (or ternary) NiTi SMA, while the SMA material is in the austenite phase. A NiTi SMA is in the austenite phase at temperatures above $A_f$, which varies for particular SMA compositions. For example, $A_f$ may vary from 40° C. to 50° C. for a compositional range of approximately 50-50.3 atom % Ni in binary TiNi alloys. While in the austenite phase, the material may be cold-worked by embossing (stamping) mesas 403-405 into flat sheets of deformable membrane 101. After plastic deformation of the SMA, the embossed mesas may have differing z-heights and may have slightly convex profiles.

In an implementation of conformable heat sink interface 400, mesas 403-405 may be compressed against corresponding dies by a controlled load while in the martensite phase at temperatures at or below a martensite-austenite phase transition start temperature ($A_s$). When deformed in the martensite phase, the material becomes superelastic, meaning its tensile characteristic (e.g., stress vs. strain curve) exhibits an extended stress plateau (e.g., constant stress) beyond the maximum strain of elastic deformation. This is due to the detwinning of the twinned martensite crystalline phase. In the superelastic state, the material may sustain up to 8% strain at a substantially constant stress before elastic and plastic deformation occur. When engaged with an IC package, the superelastic SMA material in mesas 403-405 may readily conform to any warpage or other non-planarity exhibited by the IC package. Mesas 403-405 may undergo a superelastic deformation by flattening, losing their initially convex and bloated profiles.

The shape-memory effect may then be initiated by raising the temperature of the material above $A_s$. As the dies in IC package in contact with mesas 403-405 generate heat during operation, the temperature of the SMA may exceed $A_s$, causing mesas 403-405 to attempt to regain their original shape at the time of embossing. The temperature-induced transition to the austenite phase caused by the warming dies changes the stress in the SMA material and stiffens it, causing mesas 403-405 to attempt to expand in the x, y and z-directions. By regaining their initial convexity and bloat, the SMA material loses its superelasticity and stiffens, increasing pressure against the dies underlying mesas 403-405. The increased force further increases contact pressure and may increase contact surface area between mesas 403-405 and the underlying package or dies. The increased contact surface further reduces thermal resistance, enhancing heat transfer from the dies to a heat sink that is attached over mounting plate 102 during implementation of conformable heat sink interface 400. The effect of the shape-memory transition on increasing die heat transfer efficiency is described below.

Figure 4B:
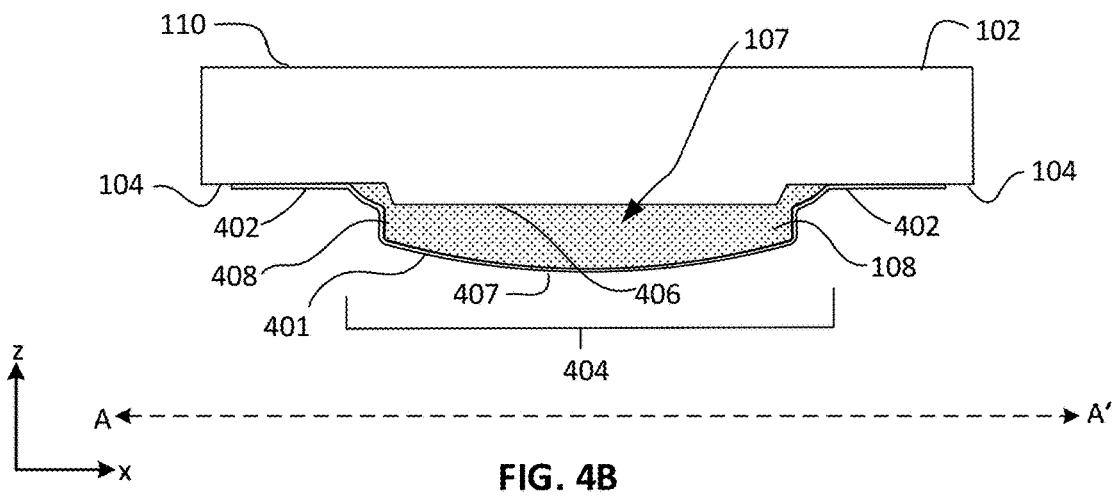
FIG. 4B illustrates a cross-sectional view in the x-z plane of conformable heat sink interface shown in FIG. 4A, according to some embodiments of the disclosure.

FIG. 4B illustrates a cross-sectional view in the x-z plane of conformable heat sink interface 400, according to some embodiments of the disclosure.

The cross-sectional plane of FIG. 4B is taken along cut line A-A' extending through mesa 404 in FIG. 4A, and is generally representative of the details of mesas 403 and 405. Deformable membrane 401 extends over mounting plate 102, and is bonded to mounting plate surface 104 along perimeter 402. In some embodiments, perimeter 402 is substantially wider than sealing rim 103 shown previously (e.g., see FIGS. 1B, 2B and 3B), but serves a similar purpose for attachment of deformable membrane 401 to mounting plate 102 as previously described in this disclosure. In some embodiments, mounting plate 102 comprises die step 406 disposed within cavity 107, which is bounded by mesa 404. Die step 406 protrudes a distance over mounting plate surface 104 into cavity 107, and may serve to provide a minimum z-height for mesa 404 if flattened. Cavity 107 is filled with flowable heat transfer medium 108 that is mostly confined between die step 406 and the portion of deformable membrane 401 providing the integument of mesa 404.

Contact surface 407 of mesa 404 is shown to be convex, as described above. In some embodiments, contact surface 407 is flat. In the illustrated embodiment, sidewalls 408 of mesa 404 are shown to be substantially straight and orthogonal to contact surface 407. In some embodiments, sidewalls 408 are slanted or curved. In some embodiments, deformable membrane 401 comprises a NiTi SMA that is in a substantially pure martensitic crystalline phase at room temperature, where mesa 404 has substantially retained its as-embossed shape. In some embodiments, the cross-sectional view of mesa 404 and the accompanying description is substantially the same in regards to mesas 403 and 405.

Figure 5:
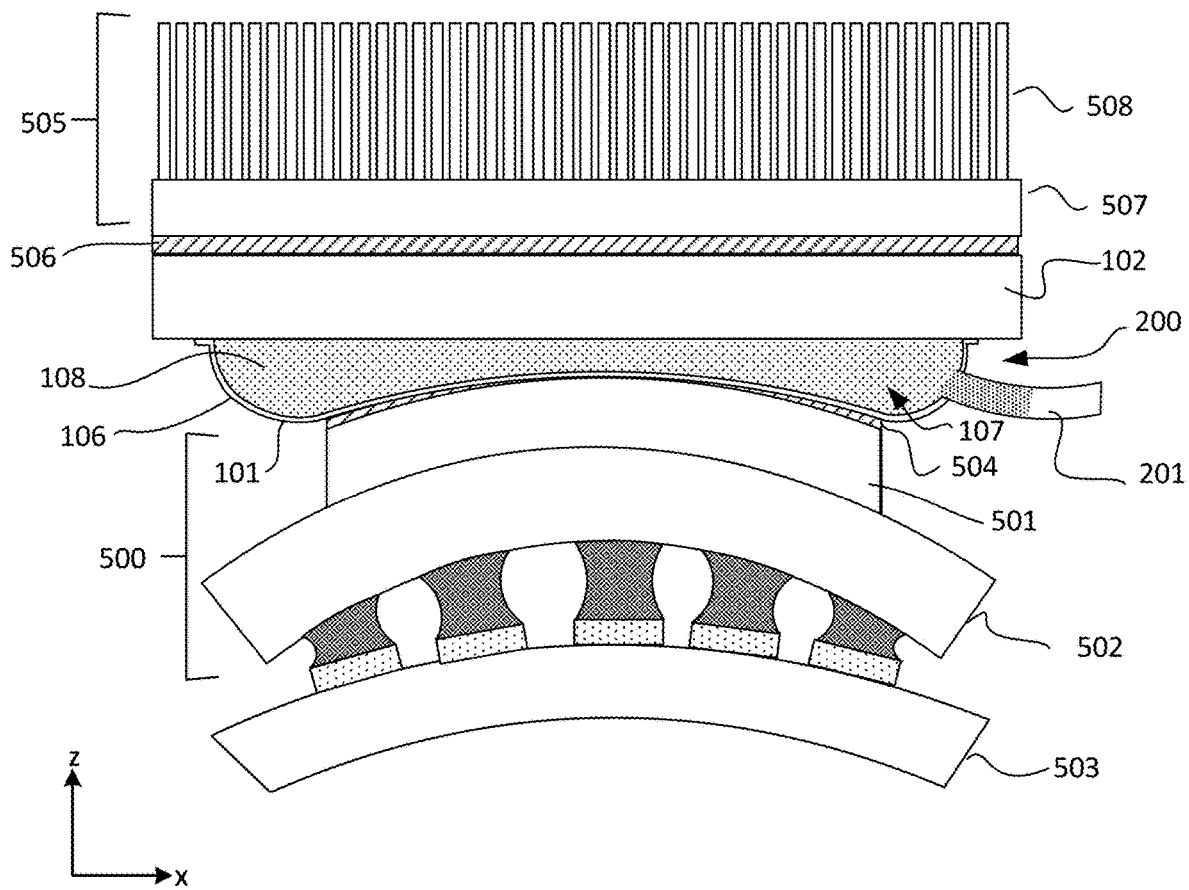
FIG. 5 illustrates a cross-sectional view in the x-z plane of a conformable heat sink interface mounted between an IC package and a thermal solution, according to some embodiments of the disclosure.

FIG. 5 illustrates a cross-sectional view in the x-z plane of conformable heat sink interface 200 mounted over IC package 500 exhibiting warpage and below heat sink, according to some embodiments of the disclosure.

An implementation embodiment of conformable heat sink interface 200 is shown in FIG. 5. Package 500, comprising die 501 bonded to substrate 502, is coupled to printed circuit board 503 by solder joints 504. In some embodiments, the printed circuit board 503 is a computer motherboard. Die 501 may be any high-density power-consuming IC device, such as, but not limited to, a microprocessor chip, a memory chip or other type of VLSI logic chip. In some embodiments, die 501 is an analog device, such as, but not limited to, a high-power audio or radio frequency amplifier. It will be understood that conformable heat sink interface 200 is an exemplary embodiment this is employed for the purposes of illustrating the implementation shown in FIG. 5. The other described embodiments, such as conformable heat sink interface 100, 300 or 400, may be equally employed in the implementation shown.

Deformable membrane 101 is in contact with die 501, which exhibits a degree of warpage that is highly exaggerated in the figure. In extreme cases, warpages of 100 microns or greater may be experienced by die 501, where the warpage is measured from the edges of die 501 to the center. As die thicknesses may range up to 1 mm, the amount of warpage may be a significant percentage of the thickness. The warpage shown is convex, but it may equally be concave. The curvature of the warpage may depend on warpage of underlying substrate 502. Stresses within the materials comprising substrate 502 may be difficult to balance, as in many cases package substrates are constructed by build-up layer methods where layers of organic dielectric are interleaved with metallization layers. The different materials may have different thermal expansion coefficients (CTEs), and stress within the package substrate may engender substrate warpage due to material mismatch. These internal stresses within the substrate cause it to warp, and may ultimately warp any dies attached to the warped substrate. Warpage may also be complicated by reflowing solder for die attachment, subjecting die and substrate to high temperatures and additional thermal stress. This additional thermal stress many cause the package and die to warp further during bonding, and permanently retain the warpage once the solder joints are formed. Additionally, any adhesives, underfills, and die/package encapsulants that are employed in the package may introduce further material mismatch, increasing or diminish warpage depending on the material CTEs. Finally, temperature increases in the die while consuming power may cause the die to warp due to internal thermal stresses during operation.

Lateral die dimensions may range from 5 mm to 50 mm. Larger dies may be more easily warped. Deformable membrane 101 conforms to the warpage curvature, sagging over the edges of die 501. Deformable membrane 101 may extend laterally beyond the extent of die 501 when engaged, to ensure complete contact with the die surface. Flowable heat transfer medium 108 accommodates the change in shape of deformable membrane 101 by redistributing toward sidewalls 106 and forming bulges that overhang the edges of die 501.

Cavity 107 within deformable membrane 101 may be reduced in volume to enhance conformability of deformable membrane 101. In some embodiments, flowable heat transfer medium 108 may generally be an incompressible liquid or solid powder. To facilitate deflation of deformable membrane 101, overflow tube 201 is provided, extending from sidewalls 106 of deformable membrane 101. Overflow tube 201 may be employed to provide a conduit for removal of excess flowable heat transfer medium 108 to accommodate any reduced volume of cavity 107, as shown in the figure by entrance of some of flowable heat transfer medium 108 into overflow tube 201.

In some embodiments, a liquid gel or high-viscosity grease thermal interface material (TIM) may intervene between die 501 and deformable membrane 101. This is shown in FIG. 5A by TIM 504, dispersed between die 501 and deformable membrane 101. Toward the edges of die 501, TIM 504 increases in thickness, filling small gaps that may be formed between deformable membrane 101 and die 501 near the edges of die 501 when engaged with deformable membrane 101. While TIM 504 may have a relatively small k (e.g., 0.5-3 W/mK), the gaps may be narrow enough to allow adequate transverse heat flow, compensating for the low k of TIM 504 compared to flowable heat transfer medium 108.

In some embodiments, flowable heat transfer medium 108 is a high-k material (e.g., k>30 W/mK), such as a liquid metal or metallic powder, as described earlier in this disclosure. As a liquid metal, flowable heat transfer medium 108 may comprise a gallium eutectic, having a relatively low viscosity of 8 cP or less. Having viscosities in this range allow flowable heat transfer medium 108 to exhibit flow properties similar to those of water or other low-viscosity liquids.

Liquid metals comprising low-temperature gallium eutectics or other compositions having comparable flow properties, are readily displaced in accordance with the shape change of deformable membrane 101, which may occur during engagement with die 501. Gallium-based liquid metals also readily wet many surfaces regardless of surface energy of the material employed in deformable membrane 101. This property may reduce the possibility of voids occurring within cavity 107 that can negate efficient heat transfer.

In some embodiments, flowable heat transfer medium 108 comprises a high-k powdered metal, dielectric, semiconductor, or a semimetal such as a graphitic or graphene-containing material. Powders such as these may be provided with particle sizes of 5 microns or less, allowing the powder to behave mechanically like a liquid. The powder may respond as a low-viscosity liquid to pressure, being somewhat compressible, allowing facile displacement of the powder to readily accommodate changes in the shape of cavity 107 according to the shape of die 501, without creating voids when deformable membrane 101 is engaged with die 501. In some embodiments, cavity 107 is coupled to external fill and pressure-compensating tubing through orifices (e.g., fill holes 109) extending through plate 507 and fins 508 of heat sink 505.

Mounting plate 102 may be interfaced to heat sink 505, as shown in FIG. 5A. Heat is transferred through flowable heat transfer medium 108 up through mounting plate 102 to heat sink 505, and transferred to the environment by fins 508. In some embodiments, TIM 506 intervenes between mounting plate 102 of conformable heat sink interface 200 and base plate 507 of heat sink 505. TIM 506 is a thermal interface material that may be different in composition to TIM 504, or may have the same composition.

Figure 6:
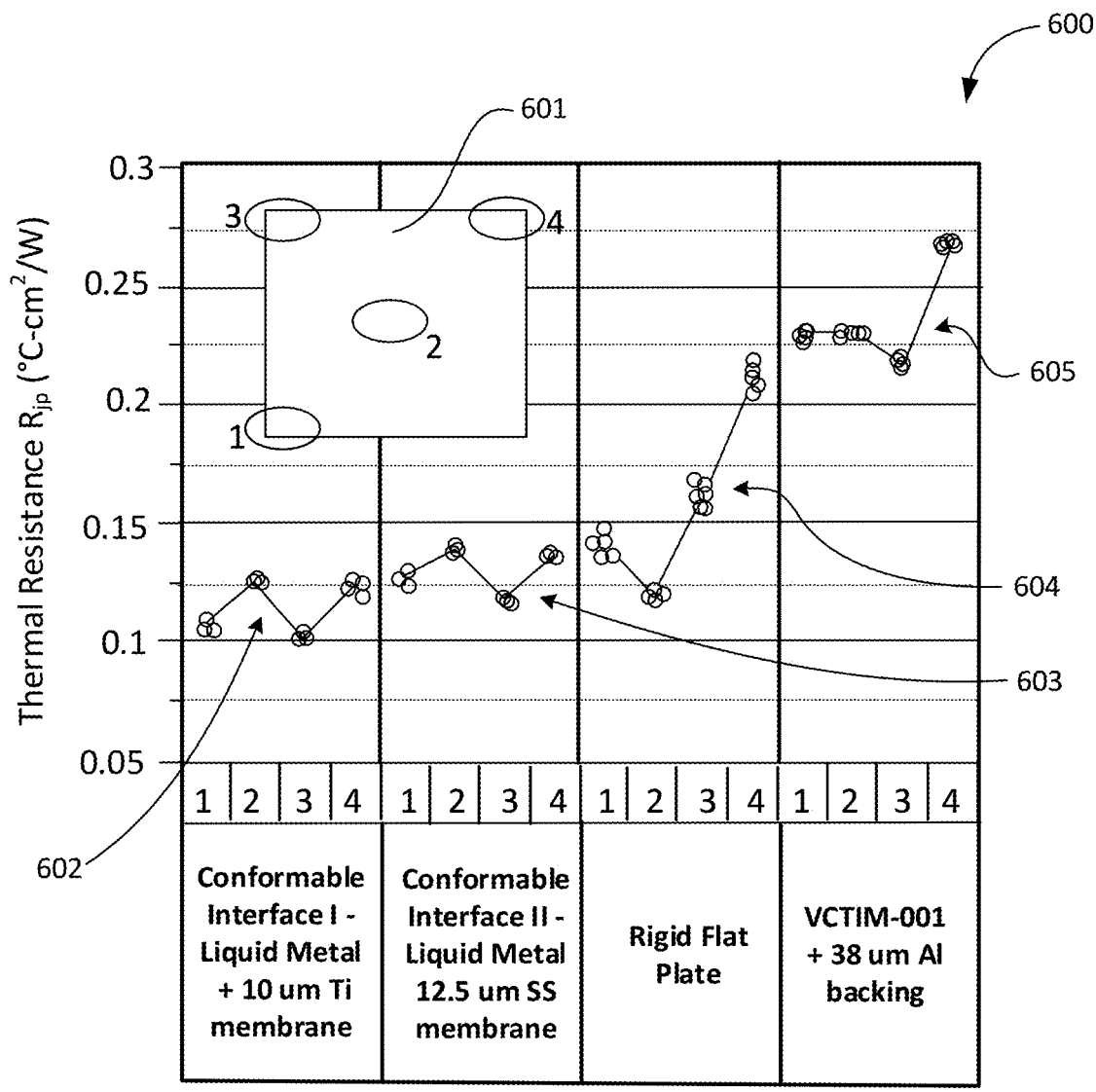
FIG. 6 illustrates a graph comprising performance data comparing a conformable heat sink interface to a conventional heat sink interface and to a semi-conformable heat sink interface, according to some embodiments of the disclosure.

FIG. 6 illustrates graph 600 comprising performance data comparing a conformable heat sink interface (e.g., conformable heat sink interface 200) to a conventional heat sink interface and to a semi-conformable vertically-oriented carbon thermal interface material (VCTIM) heat sink interface, according to some embodiments of the disclosure.

In graph 600, experimental performance data are plotted, comparing a conformable heat sink interface (e.g., conformable heat sink interface 100) measured as two separate units, a first unit having a deformable membrane comprising a pure titanium foil, and a second unit similar to the first having a deformable membrane comprising 304 stainless steel foil. The conformable units are compared to a conventional flat plate interface and a semi-deformable rubber sheet containing VCTIM-001 and a 38 micron aluminum backing sheet. The data are based on measurements of thermal resistance $R_{jp}$ values taken at four locations including the corners and in the center of a die exhibiting warpage (e.g., die 601 shown in the inset of graph 600) mounted as shown in FIG. 5. Comparisons of the measured data are plotted for each numbered location 1-4 on die 601, which is shown as an inset overlaid on graph 600. Locations 1-4 are indicated by the ovals drawn over three of the four corners (e.g., at locations 1, 3 and 4), and in the center (e.g., at location 2) of die 601. Corner location 4 has the greatest amount of warpage in comparison to the other corner locations 1 and 3.

Performance data are plotted for a rigid flat nickel plate representing a conventional heat sink base, a VCTIM-001 semi-conformable heat sink interface having a 38 micron-thick aluminum backing and two conformable heat sink interface units. The deformable membrane (e.g., deformable membrane 101) of the first unit comprises titanium sheet having an average thickness of 10 microns. The deformable membrane of the second unit comprises 304 stainless steel (SS) sheet having an overall thickness of 12.5 microns. Both units contain a gallium-based liquid metal flowable heat transfer medium (e.g., flowable heat transfer medium 108). It is noted that a liquid TIM layer having a k approximately 0.5 W/mK (compared to ~30 W/mK of a liquid metal) is spread between die 601 and the heat sink or membrane interfaces.

The performance data for each heat sink interface are grouped in plots 602, 603, 604 and 605, each having a series of multiple data points that are clustered for each of the die locations 1-4. The thermal resistance data measured at the center of die 601 (e.g., location 2) show that the conventional flat heat sink base plate is comparable to the two conformable heat sink interfaces. The two conformable heat sink interfaces and the rigid flat nickel plate outperform the semi-conformable VCTIM interface.

A small difference in performance exists between the two conformable heat transfer interface units (plots 602 and 603, respectively). The VCTIM-001 interface (plot 605) had poor heat transfer performance overall, as the thermal resistances for all of the locations of die 601 were well above the average values for each of the other three heat sink interfaces mentioned above (e.g., compare plot 605 with plots 602-604).

As seen by comparing plots 602, 603 and 604, the heat transfer performance of the rigid flat plate diverges from that of the conformable interfaces for heat transfer at the corners of die 601. For the rigid plate, the measured thermal resistance values (plot 604) at corner locations 3 and 4 are well above the average values for plots 602 and 603 relating to the conformable interfaces. For the two conformable heat sink interfaces, the thermal resistance values measured at locations 3 and 4 do not vary appreciably from the values measured at the other corner (location 1) and at the center (location 2). It was noted earlier that location 4 has a high degree of warpage relative to the other corners, and it is seen that the thermal resistance value measured at location 4 is the highest in plot 604, and in plot 605 as well.

A large bond line thickness (BLT; i.e., a gap) was present between the flat heat sink interface and locations 3 and 4 of die 601. Even when filled by the liquid TIM, the BLT was too large to provide adequate heat transfer, where heat conduction through a relatively thick layer of the liquid TIM was very slow. The same may have been true for the VCTIM-001 interface represented by plot 605.

In contrast, the conformable heat sink interfaces may have had intimate contact with all parts of die 601, as evidenced by the substantially uniform thermal resistance values at all four locations in plots 602 and 603. The data show that the heat transfer from die 601 was substantially uniform, even at location 4 where the degree of warpage was greatest.

Figure 7:
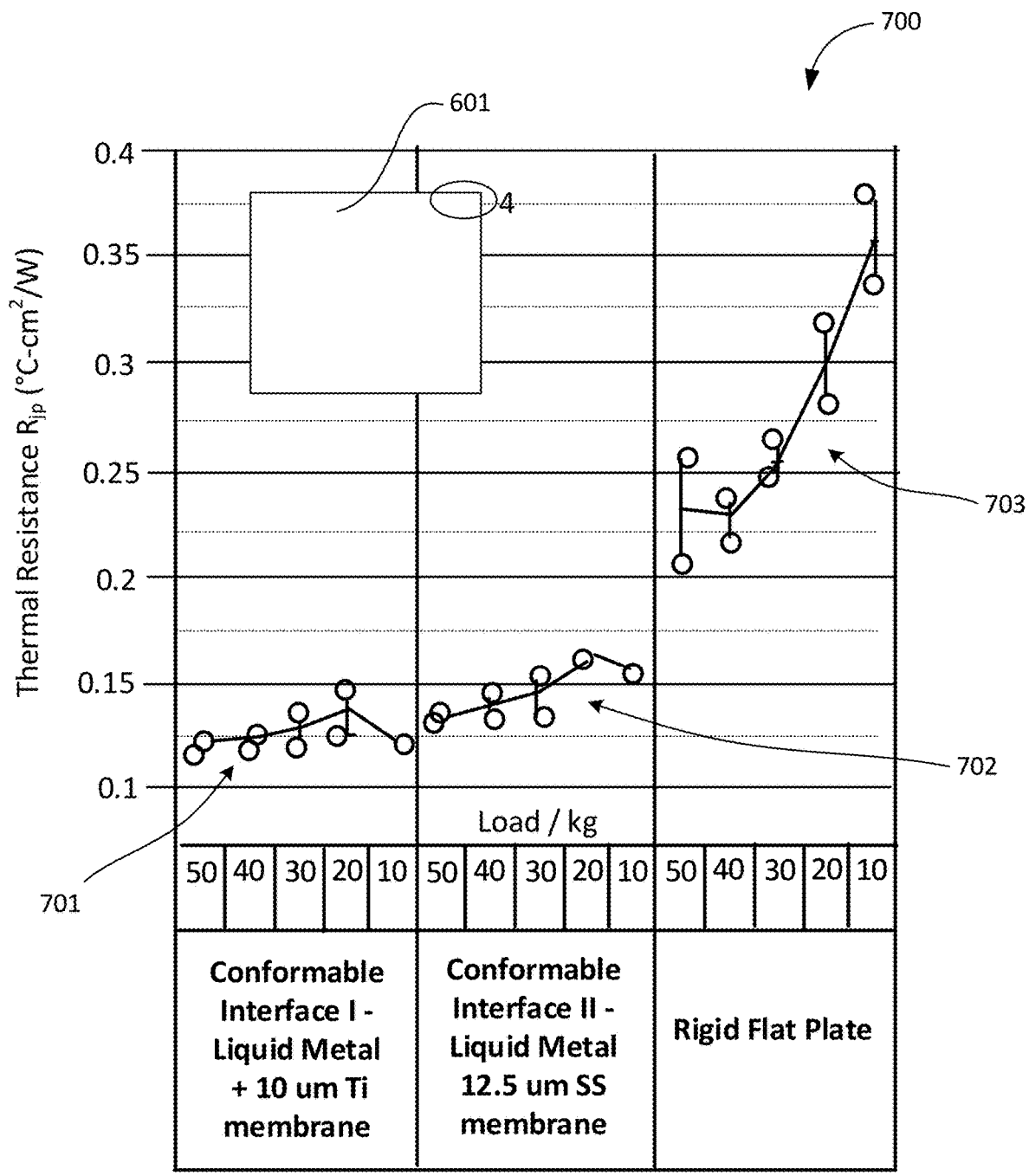
FIG. 7 illustrates a graph comprising thermal performance data as a function of load, comparing a conformable heat sink interface to a non-conformable heat sink interface, according to some embodiments of the disclosure.

FIG. 7 illustrates graph 700 comprising thermal performance data as a function of load imposed on die 601, comparing a conformable heat sink interface (e.g., conformable heat sink interface 200) to a non-conformable heat sink interface with a TIM, according to some embodiments of the disclosure.

The intimate contact with a die (e.g., die 601) that is afforded by conformable heat sink interface reduces the load on die 601 that is necessary for effective heat transfer. Graph 700 shows experimental thermal resistance data as a function of load on three types of heat sink interfaces, but only for corner location 4 on die 601, shown in the inset in graph 700. As described above, location 4 has the greatest amount of warpage of the four experimental locations. The vertical lines connecting some of the data points are error bars. The numbers at the bottom of graph 700 are values of load in kilograms (kg).

As is shown in FIG. 6, performance data are plotted for a rigid flat nickel plate representing a heat sink base, and two conformable heat sink interface units (e.g., conformable heat sink interface 200). The VCTIM-001 interface has not been included in these measurements. The deformable membrane (e.g., deformable membrane 101) of the first unit, indicated as conformable interface I in FIG. 7, comprises titanium sheet having an average thickness of 10 microns. The deformable membrane of the second unit, indicated as conformable interface II in FIG. 7, comprises a 304 stainless steel (SS) sheet having an overall thickness of 12.5 microns. Both units contain a gallium-based liquid metal flowable heat transfer medium (e.g., flowable heat transfer medium 108). It is noted that a liquid TIM layer having a k approximately 0.5 W/mK (compared to ~30 W/mK of a liquid metal) is spread between die 601 and the heat sink or membrane interfaces. Die 601 is mounted as shown in FIG. 5.

Plots 701, 702 and 703 represent a series of multiple experimental thermal resistance measurements taken at location 4 for each type of interface. As for graph 600, location 4 has the greatest degree of warpage. Plot 701 and 702 corresponds to conformable interfaces I and II, respectively, whereas plot 703 corresponds to the flat rigid nickel plate, representing a conventional heat sink baseplate. The thermal data are plotted as a function of a series of the five load values placed on the interface. The loads range from 10 to 50 kg in increments of 10 kg. It is seen that the heat transfer performance of the conventional flat plate at location 4 of die 601 is most sensitive to load, whereas the conformable heat sink interfaces have almost equal performance at all loads, with the titanium membrane having the best performance. Comparison of plots 701-703 show that performance of the conventional flat plate at the highest load is significantly inferior to the performance of the conformable interfaces under the lightest load.

In conventional microprocessor mounts, a large mechanical load on the IC package or die may be necessary to ensure the highest degree of heat transfer performance of the thermal solution. If the IC package has a large amount of warpage, the mechanical load may be increased by increasing the torque on the mounting bolts of a heat sink. As load increases, any warpage of the IC package will tend to be flattened. The bond line thickness (BLT) of a liquid TIM spread between the top of the IC package and the heat sink base plate will diminish, reducing the thermal resistance. As evidenced by plot 703, the thermal resistance at location 4 decreases steadily and dramatically with increasing load on die 601, indicating greater contact between plate and die 601. If a liquid TIM is present between the rigid plate and die 601, the BLT at location 4 decreases with increasing load as well, lowering thermal resistance. The high load conditions necessary to reduce the thermal resistance to acceptable values may also significantly stress the die, increasing chances of cracking or breakage.

In contrast, the conformable thermal solution enhances thermal contact where there is a high degree of die warpage at low load conditions. This means that the relatively small forces are imposed on the die, and that the die may remain in a warped state and still experience efficient heat transfer at marginal areas that would otherwise have slow heat transfer with conventional thermal solutions. The experimental result that is shown by graph 700 is that the conformable thermal solution in the form of the conformable heat sink interfaces according to the herein-described embodiments provide high-efficiency heat transfer that is substantially uniform across the die at loads substantially smaller than loads that may be required for a conventional rigid flat plate thermal solution (e.g., heat sink base plate 507 in FIG. 5).

Plots 701 and 702 show that the heat transfer efficiency of the conformal interface units I and II is substantially constant with load, indicating that the deformable membranes readily adapt to the contours of the significant warpage of die 601 even when the smallest load (e.g., 10 kg) is applied. Comparison of plots 701 and 702 show that conformable interface unit I performs slightly better at low loading than conformable interface unit II. The differences may be attributed to the deformable membrane materials. Titanium is more ductile than the 304 stainless steel. Comparison of plots 701 and 702 to plot 703 show that at least an 80% reduction in load for the conformal thermal solution may be realized relative to the conventional flat plate with equal or better heat transfer performance.

Figure 8:
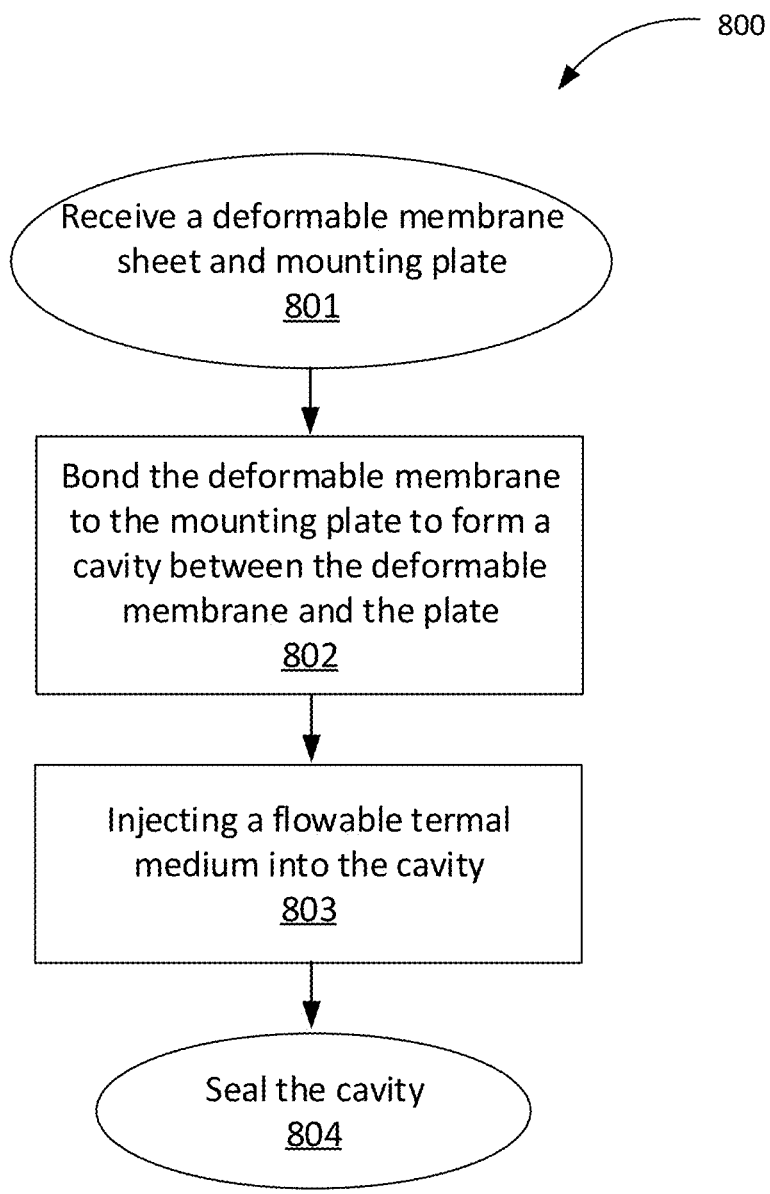
FIG. 8 illustrates a flow chart summarizing an exemplary method for making a conformable heat sink interface, according to embodiments of the disclosure.

FIG. 8 illustrates a flow chart summarizing an exemplary method for making conformable heat sink interface 100, 200, 300 or 400, according to embodiments of the disclosure.

At operation 801, materials are received for construction of a conformable heat sink interface (e.g., any of disclosed conformable heat sink interfaces 100, 200, 300 or 400). Materials include a deformable membrane (e.g., any of deformable membranes 101, 301 or 401) and a mounting plate (e.g., mounting plate 102). Suitable materials and thicknesses for the deformable membrane (e.g., deformable membrane 101) are described above, and may include titanium foil, stainless steel foil, nickel-titanium alloy foils, etc. In the case of deformable membrane 401, a SMA material such as a binary NiTi alloy may be embossed (e.g., stamped) at a temperature above a martensite-austenite phase transition temperature (explained above) to stamp in one or more mesa shapes, and engrain the shape memory into the material. The embossed mesas may have differing z-heights to compliment different z-heights of multiple dies attached to the substrate of a bare-die package.

In some embodiments, organic materials such as polyethylene sheet may also be employed to fabricate a deformable membrane. Other suitable materials are listed above.

The mounting plate may be pre-machined steel or nickel plate. A specific surface finish may be machined into the plate. In some embodiments, fill holes (e.g., fill ports 109) are machined into the mounting plate. The fill holes may be threaded and hose nipples or valves may be inserted.

At operation 802, the deformable membrane is bonded to the mounting plate as described above. Mounting methods may include, but are not limited to, brazing, soldering, welding, adhesion by use of organic adhesives or mechanical clamping (e.g., mechanical clamps as shown in FIGS. 3A and 3B) to seal the perimeter of the deformable membrane to the mounting plate. In some embodiments, the deformable membrane is bonded about the perimeter (e.g., sealing rim 103) may be bonded directly to the mounting plate, forming a cavity (e.g., cavity 107) between a portion of the mounting plate surface and the interior side of the deformable membrane.

In some embodiments, the deformable membrane is received in the form of a closed sac (e.g., closed deformable membrane 301) that is mechanically secured to the mounting plate as shown in FIGS. 3A and 3B. By mechanical securement, the deformable membrane (e.g., deformable membrane 301) may be removed from the mounting plate. The closed sac may also be permanently bonded by the methods such as brazing, soldering, welding and the use of organic adhesives mentioned above.

At operation 803, a flowable heat transfer medium (e.g., flowable heat transfer medium 108) is injected into the cavity (e.g., cavity 107) of the deformable membrane. As described above, the flowable heat transfer medium is inserted within the cavity of the deformable membrane. In some embodiments, the deformable membrane comprises a sealable filling port (e.g., port fill tab 302) or fill tubing (e.g., fill/overflow tube 201). In some embodiments, the mounting plate (e.g., mounting plate 102) carries filling ports (e.g., fill ports 109). In some embodiments, the flowable heat transfer medium is a liquid metal that is in the liquid state at temperatures below 30° C. The liquid metal may be introduced under positive pressure into the cavity. In some embodiments, the flowable heat transfer medium is a powder that is introduced by a suitable powder introduction method.

At operation 804, the cavity is sealed. In embodiments comprising a fill tube (e.g., conformable heat sink interface 200), a fill tube stub may be attached to a sidewall (e.g., sidewall 106) of the formable membrane. Once the cavity of the deformable membrane is filled, the filling tube may be sealed by a cap, a clamp or a pinch closure. In some embodiments, the fill tube may extend a length that is sufficient to take up overflow of the liquid metal for pressure equalization within the cavity, keeping the liquid metal with at substantially atmospheric pressure.

In embodiments comprising a fill tab (e.g., conformable heat sink interface 300), the fill tab (fill tab 302) may have a resealable membrane that can be reversibly closed after filling by a clamping mechanism, or wax. In some embodiments, the fill tab is sealed permanently by solder, organic adhesive, or a removable cap.

Figure 9:
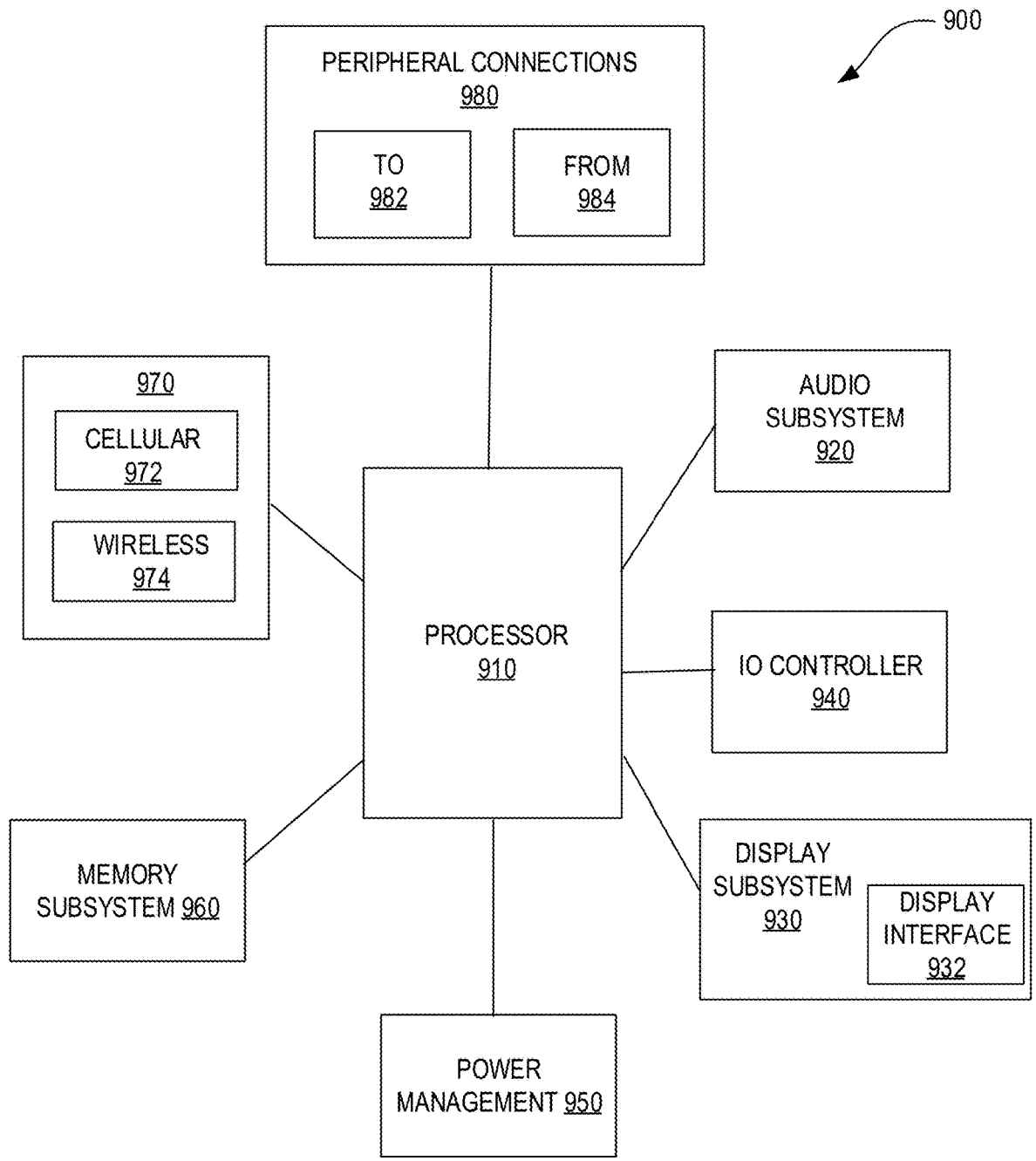
FIG. 9 illustrates a block diagram of a computing device comprising an IC package having one or more dies as part of a system-on-chip (SoC) package in an implementation of a computing device, according to some embodiments of the disclosure.

FIG. 9 illustrates a block diagram of computing device 900 comprising an IC package having one or more dies as part of a system-on-chip (SoC) package in an implementation of a computing device, according to some embodiments of the disclosure.

According to some embodiments, computing device 900 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., processor 910 representing a central processing unit (CPU) or a graphical processing unit (GPU)), comprising one or more dies, is mounted on a motherboard of computing device 900. The IC package may dissipate a large amount of heat, where a high-efficiency thermal solution is required. In addition, the IC package may have significant amount of warpage or otherwise exhibit significant non-planarity.

According to some embodiments, computing device 900 employs a conformable heat sink interface (e.g., any one of conformable heat sink interfaces 100, 200, 300 or 400 of the disclosure) mounted between the IC package and a thermal solution, where the conformable heat sink interface conforms to the contours of the warped or otherwise non-planar IC package, making contact with substantially 100% of the surface of the IC package at significantly reduced load on the IC package in comparison with a conventional thermal solution, as described above. An IC package may be mounted in a thermal solution mount where the IC package (e.g., IC package 500) is sandwiched between a conformable heat sink interface according to some embodiments of the disclosure (e.g., conformable heat sink interface 100, 200, 300 or 400) and a PCB or socket, as shown in FIG. 5.

In some embodiments, computing device has wireless connectivity (e.g., Bluetooth and/or WiFi). It will be understood that certain components are shown generally, and not all components of such a device are shown in computing device 900.

The various embodiments of the present disclosure may also comprise a network interface within 970 such as a wireless interface so that a system embodiment may be incorporated into a wireless device, for example, cell phone or personal digital assistant.

According to some embodiments, processor 910 represents a CPU or a GPU, and can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910.

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A conformable heat sink interface for an integrated circuit package,
comprising,
a deformable membrane having a portion thereof bonded to a surface of a plate,
wherein a cavity is between the surface of the plate and the deformable membrane; and
a flowable heat transfer medium within the cavity,
wherein the deformable membrane is to conform to a three-dimensional shape of an integrated circuit package and the plate is to be adjacent to fins of a heat sink,
wherein the deformable membrane comprises a shape memory alloy and is embossed with one or more mesas, the one or more mesas to align with and abut against one or more dies of the integrated circuit package.

2. The conformable heat sink interface of claim 1, wherein the flowable heat transfer medium is a liquid metal having a liquidus temperature of not more than 30° C.

3. The conformable heat sink interface of claim 2, wherein the liquid metal comprises at least one of gallium, indium tin or zinc.

4. The conformable heat sink interface of claim 1, wherein at least one orifice extends through the plate over the cavity, and wherein the at least one orifice is surrounded by the deformable membrane.

5. The conformable heat sink interface of claim 1, wherein the deformable membrane has a thickness in the range of 10 and 50 microns.

6. The conformable heat sink interface of claim 1, wherein the deformable membrane comprises at least one of tungsten, tantalum, niobium, titanium, molybdenum, iron or nickel.

7. The conformable heat sink interface of claim 1, wherein the deformable membrane is bonded to the plate by at least one of a brazed joint, a weld joint, a solder joint, or an organic adhesive seal between the deformable membrane and the plate.

8. The conformable heat sink interface of claim 1, wherein the shape memory alloy comprises at least one of nickel, titanium, cobalt, copper, aluminum, zinc, iron, manganese or silicon.

9. The conformable heat sink interface of claim 1, wherein one of the one or more mesas has lateral dimensions comprising a length and a width that are not less than lateral dimensions of a corresponding one of one or more dies.

10. The heat-exchange mount of claim 1, wherein the flowable heat transfer medium has a thermal conductivity of not less than 30 W/m K.

11. The conformable heat sink interface of claim 1, wherein the plate comprises a step protruding over the surface of the plate and aligned with one of the one or more mesas.

12. An integrated circuit package mounting assembly, comprising:
an integrated circuit package coupled to a printed circuit board, the integrated circuit package comprising one or more dies attached to a substrate;
a power supply coupled to the integrated circuit package through the printed circuit board;
a heat sink; and
a conformable heat sink interface between the integrated circuit package and the heat sink, the conformable heat sink interface comprising:
a mounting plate having a first surface adjacent to a base of the heat sink;
a deformable membrane having a portion thereof bonded to a second surface of the mounting plate, wherein a cavity is between the second surface of the mounting plate and the deformable membrane; and
a flowable heat transfer medium within the cavity, wherein the deformable membrane is to conform to a three-dimensional shape of the integrated circuit package to enhance heat transfer between the integrated circuit package and the mounting plate, wherein the deformable membrane comprises a shape memory alloy and is embossed with one or more mesas, wherein the one or more mesas are aligned to the one or more dies such that the one or more dies are abutted by the one or more mesas.

13. The integrated circuit package mounting assembly of claim 12, wherein the integrated circuit package comprises a microprocessor.

14. The integrated circuit package mounting assembly of claim 12, wherein the flowable heat transfer medium has a thermal conductivity of not less than 30 W/m K.

15. The integrated circuit package mounting assembly of claim 12, wherein a thermal interface material (TIM) layer is between the integrated circuit package and the deformable membrane.

16. The integrated circuit package mounting assembly of claim 12, wherein the cavity is coupled to pressure compensation tubing through orifices extending through the heat sink.

17. A method for making a conformable thermal interface, comprising:
   bonding a deformable membrane to a plate to form a seal around a cavity between the deformable membrane and the plate; and
   injecting a flowable thermal medium into the cavity, wherein the deformable membrane comprises a shape memory alloy, wherein the deformable membrane is embossed at a temperature above a transition temperature of the shape memory alloy to form a raised region having lateral dimensions comprising a length and a width that are not less than the lateral dimensions of a die.

18. The method for making a conformable thermal interface of claim 17, wherein bonding the deformable membrane to the plate comprises at least one of braze welding the deformable membrane to the plate, soldering the deformable membrane to the plate or adhering the deformable membrane to the plate with an organic adhesive.

19. The method for making the conformable thermal interface of claim 17, wherein injecting the flowable thermal medium into the cavity comprises:
   injecting the flowable thermal medium into the cavity through one or more orifices in the plate,
      wherein the one or more orifices extend though the plate and into the cavity:
   injecting the flowable thermal medium into the cavity through a sealable fill hole in the deformable membrane; or
   injecting the flowable thermal medium into the cavity through a tube extending into the cavity, wherein the flowable thermal medium is a liquid metal or an organic liquid.

20. The method for making the conformable thermal interface of claim 17, wherein the flowable heat transfer medium has a thermal conductivity of not less than 30 W/m K.

\* \* \* \* \*